US010636669B2

United States Patent
Chen et al.

(10) Patent No.: US 10,636,669 B2
(45) Date of Patent: Apr. 28, 2020

(54) SEAM HEALING USING HIGH PRESSURE ANNEAL

(71) Applicant: Applied Materials, Inc., Santa Clara, CA (US)

(72) Inventors: Yihong Chen, San Jose, CA (US); Rui Cheng, Santa Clara, CA (US); Pramit Manna, Santa Clara, CA (US); Abhijit Basu Mallick, Fremont, CA (US); Shishi Jiang, Santa Clara, CA (US); Yong Wu, Mountain View, CA (US); Kurtis Leschkies, San Jose, CA (US); Srinivas Gandikota, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/246,711

(22) Filed: Jan. 14, 2019

(65) Prior Publication Data
US 2019/0228982 A1    Jul. 25, 2019

Related U.S. Application Data

(60) Provisional application No. 62/621,423, filed on Jan. 24, 2018.

(51) Int. Cl.
*H01L 21/31* (2006.01)
*H01L 21/3105* (2006.01)
(Continued)

(52) U.S. Cl.
CPC ........ *H01L 21/31051* (2013.01); *C23C 16/56* (2013.01); *G06F 1/00* (2013.01); *H01L 21/0228* (2013.01); *H01L 21/02164* (2013.01); *H01L 21/02211* (2013.01); *H01L 21/02271* (2013.01); *H01L 21/02323* (2013.01); *H01L 21/02337* (2013.01); *H01L 21/6719* (2013.01); *H01L 21/67103* (2013.01); *H01L 21/67109* (2013.01);
(Continued)

(58) Field of Classification Search
CPC ........ H01L 21/02323; H01L 21/02337; H01L 21/02164; H01L 21/02065; C23C 16/56
See application file for complete search history.

(56) References Cited

U.S. PATENT DOCUMENTS

| 4,524,587 A | 6/1985 | Kantor |
| 5,050,540 A | 9/1991 | Lindberg |

(Continued)

FOREIGN PATENT DOCUMENTS

| CN | 101871043 A | 10/2010 |
| CN | 104047676 A | 9/2014 |

(Continued)

OTHER PUBLICATIONS

Office Action for Japanese Application No. 2018-546484 dated Oct. 8, 2019.

(Continued)

*Primary Examiner* — William Coleman
(74) *Attorney, Agent, or Firm* — Patterson + Sheridan LLP

(57) ABSTRACT

Aspects of the disclosure include methods of processing a substrate. The method includes depositing a conformal layer on a substrate which contains seams. The substrate is treated using a high pressure anneal in the presence of an oxidizer.

20 Claims, 6 Drawing Sheets

(51) Int. Cl.
*H01L 21/02* (2006.01)
*C23C 16/56* (2006.01)
*H01L 21/67* (2006.01)
*H01L 21/687* (2006.01)
*G06F 1/00* (2006.01)

(52) U.S. Cl.
CPC .. *H01L 21/67126* (2013.01); *H01L 21/68742* (2013.01); *H01L 21/68771* (2013.01); *H01L 21/67248* (2013.01)

(56) References Cited

U.S. PATENT DOCUMENTS

| | | |
|---|---|---|
| 5,114,513 A | 5/1992 | Hosokawa et al. |
| 5,149,378 A | 9/1992 | Ohmi et al. |
| 5,175,123 A | 12/1992 | Vasquez et al. |
| 5,319,212 A | 6/1994 | Tokoro |
| 5,366,905 A * | 11/1994 | Mukai .................. H01L 21/7684 257/E21.583 |
| 5,590,695 A | 1/1997 | Siegele et al. |
| 5,620,524 A | 4/1997 | Fan et al. |
| 5,808,245 A | 9/1998 | Wiese et al. |
| 5,858,051 A | 1/1999 | Komiyama et al. |
| 5,879,756 A | 3/1999 | Fathi et al. |
| 5,880,041 A | 3/1999 | Ong |
| 5,940,985 A | 8/1999 | Kamikawa et al. |
| 6,082,950 A | 7/2000 | Attwood et al. |
| 6,136,664 A | 10/2000 | Economikos et al. |
| 6,150,286 A | 11/2000 | Sun et al. |
| 6,164,412 A | 12/2000 | Allman |
| 6,242,368 B1 | 6/2001 | Holmer et al. |
| 6,251,751 B1 | 6/2001 | Chu et al. |
| 6,299,753 B1 | 10/2001 | Chao et al. |
| 6,319,766 B1 | 11/2001 | Bakli et al. |
| 6,334,266 B1 | 1/2002 | Moritz et al. |
| 6,368,412 B1 | 4/2002 | Gomi |
| 6,442,980 B2 | 9/2002 | Preston et al. |
| 6,500,603 B1 | 12/2002 | Shioda |
| 6,583,497 B2 | 6/2003 | Xia et al. |
| 6,619,304 B2 | 9/2003 | Worm |
| 6,797,336 B2 | 9/2004 | Garvey et al. |
| 7,055,333 B2 | 6/2006 | Leitch et al. |
| 7,111,630 B2 | 9/2006 | Mizobata et al. |
| 7,114,517 B2 | 10/2006 | Sund et al. |
| 7,282,458 B2 | 10/2007 | Gates et al. |
| 7,361,231 B2 | 4/2008 | Fury et al. |
| 7,460,760 B2 | 12/2008 | Cho et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,825,038 B2 | 11/2010 | Ingle et al. |
| 7,825,042 B2 | 11/2010 | Mandal |
| 7,867,923 B2 | 1/2011 | Mallick et al. |
| 7,891,228 B2 | 2/2011 | Ding et al. |
| 8,027,089 B2 | 9/2011 | Hayashi |
| 8,318,584 B2 | 11/2012 | Li et al. |
| 8,349,085 B2 | 1/2013 | Tahara et al. |
| 8,449,942 B2 | 5/2013 | Li et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,647,992 B2 | 2/2014 | Liang et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,257,314 B1 | 2/2016 | Rivera et al. |
| 9,306,026 B2 | 4/2016 | Toriumi et al. |
| 9,362,107 B2 | 6/2016 | Thadani et al. |
| 9,484,406 B1 | 11/2016 | Sun et al. |
| 9,570,551 B1 | 2/2017 | Balakrishnan et al. |
| 10,083,834 B2 | 9/2018 | Thompson et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2002/0073922 A1 | 6/2002 | Frankel et al. |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2003/0030945 A1 | 2/2003 | Heinonen et al. |
| 2003/0101938 A1 | 6/2003 | Ronsse et al. |
| 2003/0148035 A1 | 8/2003 | Lingampalli |
| 2003/0148631 A1 * | 8/2003 | Kuo .................. H01L 21/02137 438/782 |
| 2003/0207593 A1 | 11/2003 | Derderian et al. |
| 2004/0025908 A1 | 2/2004 | Douglas et al. |
| 2004/0060519 A1 | 4/2004 | Beauchaine et al. |
| 2004/0112409 A1 | 6/2004 | Schilling |
| 2004/0219800 A1 | 11/2004 | Tognetti |
| 2004/0248392 A1 | 12/2004 | Narwankar et al. |
| 2005/0003655 A1 | 1/2005 | Cathey et al. |
| 2005/0051194 A1 | 3/2005 | Sakashita et al. |
| 2005/0136684 A1 | 6/2005 | Mukai et al. |
| 2005/0191828 A1 | 9/2005 | Al-Bayati et al. |
| 2005/0198971 A1 | 9/2005 | Leitch et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0124613 A1 | 6/2006 | Kumar et al. |
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0187386 A1 | 8/2007 | Kim et al. |
| 2007/0204797 A1 | 9/2007 | Fischer |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0115726 A1 | 5/2008 | Ingle et al. |
| 2008/0210273 A1 | 9/2008 | Joe |
| 2009/0081884 A1 | 3/2009 | Yokota et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0173495 A1 | 7/2010 | Thakur et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0045300 A1 | 2/2014 | Chen et al. |

(56) References Cited

U.S. PATENT DOCUMENTS

| | | |
|---|---|---|
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |
| 2014/0231384 A1 | 8/2014 | Underwood et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0284821 A1 | 9/2014 | Hubbard |
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0099342 A1 | 4/2015 | Tsai et al. |
| 2015/0159272 A1 | 6/2015 | Yoon et al. |
| 2015/0179501 A1 | 6/2015 | Jhaveri et al. |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0334162 A1 | 11/2016 | Kim et al. |
| 2016/0353522 A1 | 12/2016 | Rathi et al. |
| 2017/0005204 A1 | 1/2017 | Hosoba et al. |
| 2017/0011932 A1 | 1/2017 | Pethe et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0023192 A1 | 1/2018 | Chandra et al. |
| 2018/0261480 A1 | 9/2018 | Liang et al. |
| 2018/0350563 A1 | 12/2018 | Manna et al. |
| 2019/0259625 A1* | 8/2019 | Nemani ............ H01L 21/0337 |

FOREIGN PATENT DOCUMENTS

| | | | |
|---|---|---|---|
| CN | 104089491 A | | 10/2014 |
| JP | H07048489 B2 | | 5/1995 |
| JP | 2001110729 A | | 4/2001 |
| JP | 2003-51474 A | | 2/2003 |
| JP | 2004127958 A | | 4/2004 |
| JP | 2005064269 A | | 3/2005 |
| JP | 2005-333015 A | | 12/2005 |
| JP | 2007242791 A | | 9/2007 |
| JP | 2008/073611 A | | 4/2008 |
| JP | 2010-205854 A | | 9/2010 |
| JP | 2012-503883 A | | 2/2012 |
| JP | 2012-204656 A | | 10/2012 |
| JP | 2013-105777 A | | 5/2013 |
| JP | 2013516788 A | | 5/2013 |
| JP | 2013-179244 A | | 9/2013 |
| JP | 2014019912 A | | 2/2014 |
| KR | 20070075383 A | | 7/2007 |
| KR | 20090011463 A | | 2/2009 |
| KR | 1020090040867 A | | 4/2009 |
| KR | 20140003776 A | | 1/2014 |
| KR | 20140135744 A | | 11/2014 |
| KR | 20150006587 A | | 1/2015 |
| KR | 20150122432 A | | 11/2015 |
| TW | 200529284 A | | 9/2005 |
| TW | 200721316 A | | 6/2007 |
| TW | 201507174 A | | 2/2015 |
| WO | 2008/089178 A2 | | 7/2008 |
| WO | 2011/103062 A2 | | 8/2011 |
| WO | 2012/133583 A1 | | 10/2012 |
| WO | 2016065219 A1 | | 4/2016 |

OTHER PUBLICATIONS

International Search Report and Written Opinion for International Application No. PCT/US2019/040195 dated Oct. 25, 2019.
International Search Report and Written Opinion for International Application No. PCT/US2019/029602 dated Aug. 14, 2019.
International Search Report and Written Opinion for PCT/US2018/021715 dated Jun. 22, 2018.
International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/043160 dated Jan. 31, 2019.
International Search Report and Written Opinion dated Jan. 31, 2019 for Application No. PCT/US2018/042760.
International Search Report and Written Opinion for PCT/US2018/059643 dated Feb. 26, 2019.
International Search Report and Written Opinion from PCT/US2019/012161 dated Apr. 30, 2019.
International Search Report and Written Opinion for PCT/US2019/014759 dated May 14, 2019.
International Search Report and Written Opinion for PCT/US2019/015332 dated May 15, 2019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136181.
Taiwan Office Action dated Jun. 11, 2019 for Application No. 107138905.
Taiwan Office Action dated Nov. 19, 2019 for Application No. 108103415.
Office Action for Japanese Application No. 2018-517285 dated Oct. 23, 2019.

(56) References Cited

OTHER PUBLICATIONS

Office Action for Taiwan Patent Application No. 108111501 dated Nov. 14, 2019.

* cited by examiner

SEAM HEALING USING HIGH PRESSURE ANNEAL

CROSS-REFERENCE TO RELATED APPLICATIONS

This application claims priority of U.S. Provisional Application No. 62/621,423, filed Jan. 24, 2018, which is hereby incorporated by reference in its entirety.

BACKGROUND

Field

Embodiments of the present disclosure generally relate to integrated circuit fabrication methods, and in particular, to correcting seam defects in semiconductor devices.

Description of the Related Art

The miniaturization of semiconductor devices continues to require increasing complexity of geometry and arrangement of material layers which form the device. Among these, properly filling features formed on the semiconductor device, such as trenches and vias, with a material is increasingly difficult due to the shrinking size of the features.

Features are typically filled by a deposition process, such chemical vapor deposition (CVD), physical vapor deposition (PVD), or plating processes, which can result in less than optimal filling of the features. Problems arise from the accumulation of material at the upper surface of the feature. The accumulation of such material at the edges of the feature can block or otherwise obstruct the feature prior to completely and evenly filling the feature, resulting in the formation of voids, seams, and uneven structures within the feature. The smaller features that are used in smaller geometry devices, such as trenches in the tens-of-nanometer range, necessarily have a larger aspect ratio (i.e., relationship of feature height to width) than do larger geometry devices, thereby exacerbating the trench and via filling difficulties described above.

Conventional approaches utilize multiple cycles of deposition and anneal in attempt to repair seams and cavities in the features. However, these conventional approaches result in extremely slow process time. Further, these approaches can damage the material of the semiconductor device and cause reliability issues in the operation of the semiconductor device.

Therefore, there is a need for an improved method of correcting seam defects.

SUMMARY

In one embodiment, a method of processing a substrate is provided, including positioning a substrate with a plurality of substrate features in a process chamber, depositing a conformal layer on the substrate features, and treating the substrate with a high pressure anneal. A seam is formed between neighboring substrate features when the conformal layer is deposited. The high pressure anneal is performed in the presence of an oxidizer. The volume of the seams within the conformal layer are reduced by the high pressure anneal.

In another embodiment, a method of processing a substrate is provided, including positioning a substrate with a plurality of substrate features in a process chamber, depositing a conformal layer on the substrate features, and treating the substrate with a high pressure anneal. The conformal layer is crystalline in structure. A seam is formed between neighboring substrate features when the conformal layer is deposited. The high pressure anneal is performed in the presence of an oxidizer. The volume of the seams within the conformal layer are reduced by the high pressure anneal.

In another embodiment, a method of processing a substrate is provided, including positioning a substrate with a plurality of substrate features in a process chamber, depositing a conformal layer on the substrate features, and treating the substrate with a high pressure anneal. The conformal layer is crystalline in structure. A seam is formed between neighboring substrate features when the conformal layer is deposited. The high pressure anneal is performed in the presence of an oxidizer. The volume of the seams within the conformal layer are reduced by the high pressure anneal. The volume of the conformal layer expands during the high pressure anneal.

The high pressure anneal helps reduce the size of the seams located between conformal films, where the conformal films are disposed on adjacent features of the semiconductor. The reduction in seam size increases the electrical insulating properties of the conformal film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure provided herein include methods of treating a substrate to remove defects, such as seams, in interconnects formed on the substrate. In some embodiments, the method includes heating the substrate in a pressurized environment in the presence of an oxidizer. The conformal layers deposited on the substrate expand in volume, such that the conformal layers on opposing sides of a seam chemically cross-link with one another, reducing or eliminating the seams. Embodiments of the disclosure may prove useful for, but are not limited to, decreasing the size of seams on substrate features.

Figure 1:
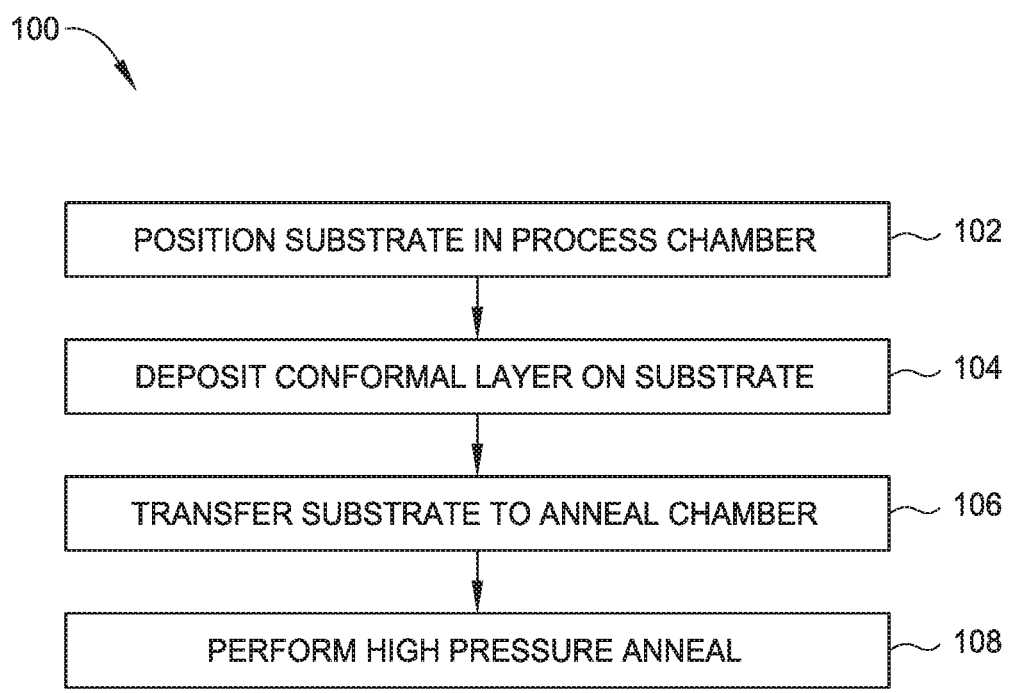
FIG. 1 is a flowchart of a method of processing a substrate according to one embodiment of the disclosure.

FIG. 1 is a flow diagram of a method 100 for processing a substrate 210, according to one embodiment of the disclosure. FIGS. 2A-2D are schematic sectional views a substrate at stages of the method 100. To facilitate explanation of aspects of the disclosure, FIGS. 2A-2D will be explained in conjunction with FIG. 1.

Method 100 begins at operation 102. In operation 102, a substrate 210 is positioned in a process chamber. The process chamber is, for example, a deposition chamber. The substrate 210 includes one or more substrate features 212 formed thereon. Here, the substrate features 212 are four trenches. The substrate 210 can be a photomask, a semiconductor wafer, or other workpiece. The substrate 210 comprises any material to make any of integrated circuits, passive (e.g., capacitors, inductors) and active (e.g., transistors, photo detectors, lasers, diodes) microelectronic devices, according to some embodiments. The substrate 210 comprises insulating or dielectric materials that separate such active and passive microelectronic devices (or features thereof) from a conducting layer or layers that are formed on the substrate. In one embodiment, the substrate 210 is a semiconductor substrate that includes one or more dielectric layers e.g., silicon dioxide, silicon nitride, aluminum oxide, and other dielectric materials. In one embodiment, the substrate 210 includes a one or more layers of films. The one or more layers of the substrate 210 can include conducting layers, semiconducting layers, insulating layers, or any combination thereof.

At operation 104, a conformal layer 214 is deposited in the substrate features 212. The conformal layer 214 is a silicon-containing layer, such as a silicon dioxide layer, according to one embodiment. The conformal layer 214 is a metal oxide layer, such as aluminum oxide or vanadium oxide, according to one embodiment. The conformal layer 214 is formed by a deposition process. The deposition process is chemical vapor deposition (CVD) or atomic layer deposition (ALD), according to some embodiments. To deposit the conformal layer 214, a first precursor is flowed into the processing chamber. The precursor may comprise silicon (Si) and hydrogen (H). According to some embodiments, the precursor comprises a silane precursor, a disilane precursor, a trisilane precursor, or a tetrasilane precursor. The first precursor is reacted with a second precursor gas, such as an oxidizing agent, for example ozone or oxygen radicals, to form silicon dioxide within the substrate features 212. The deposition process occurs at a processing temperature in a range, for example, between about 150 degrees Celsius and about 700 degrees Celsius, between about 250 degrees Celsius and about 600 degrees Celsius, between about 300 degrees Celsius and about 550 degrees Celsius, such as between about 350 degrees Celsius and about 500 degrees Celsius. Additionally, during deposition, the chamber is maintained at a reduced pressure. For example, the pressure in the chamber may be between about 5 Torr and about 700 Torr, between about 10 Torr and about 600 Torr, such as between about 15 Torr and about 500 Torr.

Figure 2A:
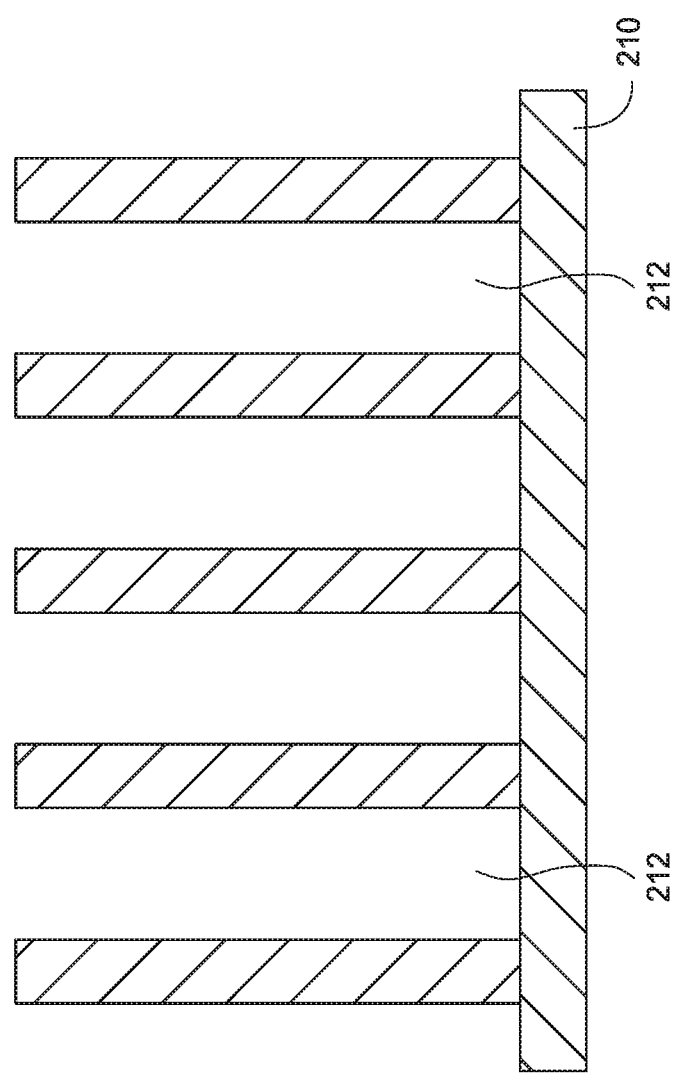
FIG. 2A is a sectional view of a substrate at one operation of the method of FIG. 1.
Figure 2B:
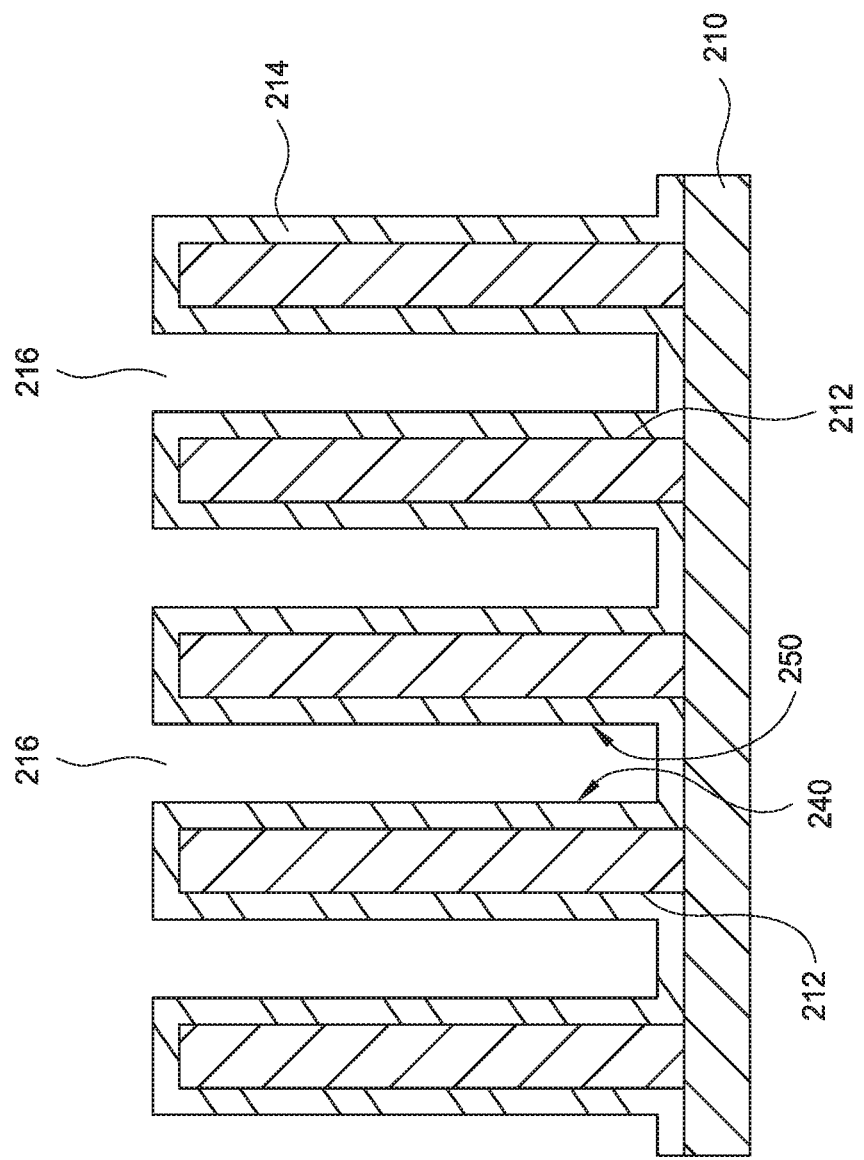
FIG. 2B is a sectional view of a substrate at one operation of the method of FIG. 1.

As shown in FIG. 2B, the deposited conformal layer 214 is deposited on the substrate 210 in the substrate features 212. The conformal layer 214 conforms to the shape of the substrate features 212, thereby forming a seam 216 within the substrate features 212. It is to be noted that the seam 216 is exaggerated in size for clarity. In some aspects, the conformal layer 214 formed on adjacent structures defining the substrate features 212 may be deposited to a thickness sufficient to contact the conformal layer 214 on an opposite surface of a respective substrate feature 212. Stated otherwise, the seam 216 need not necessarily include a physical void, but rather, the seam 216 may form as a result of portions 240, 250 of the conformal layer 214 contacting one another, for example, within the substrate feature 212. The presence of the seam 216 negatively affects performance of the gapfill within substrate feature 212 by decreasing the electrical insulating properties thereof.

The substrate 210, having the conformal layer 214 thereon, is transferred to an anneal chamber at operation 106. At operation 108, the substrate 210 is treated with a high pressure anneal. The high pressure anneal is performed with the substrate 210 in the presence of an oxidizer 220 such as steam or a steam/oxygen mixture. The substrate 210 is annealed at an annealing temperature. The annealing temperature is about 100 degrees Celsius to about 600 degrees Celsius, such as about 150 degrees Celsius to about 550 degrees Celsius, or about 200 degrees Celsius to about 500 degrees Celsius.

The pressure within the anneal chamber is raised to a predetermined pressure in order to perform the high pressure anneal. The predetermined pressure is between about 1 bar and about 90 bar, such as about 1 bar to about 80 bar, or about 1 bar to about 70 bar. The increased pressure forces the oxidizer 220 within the environment of the anneal chamber down into the seams of the conformal layer 214. The substrate 210 is treated with the high pressure anneal for a desired soak time. The soak time is generally about 3 minutes to about 150 minutes, such as about 5 minutes to about 120 minutes.

Figure 2C:
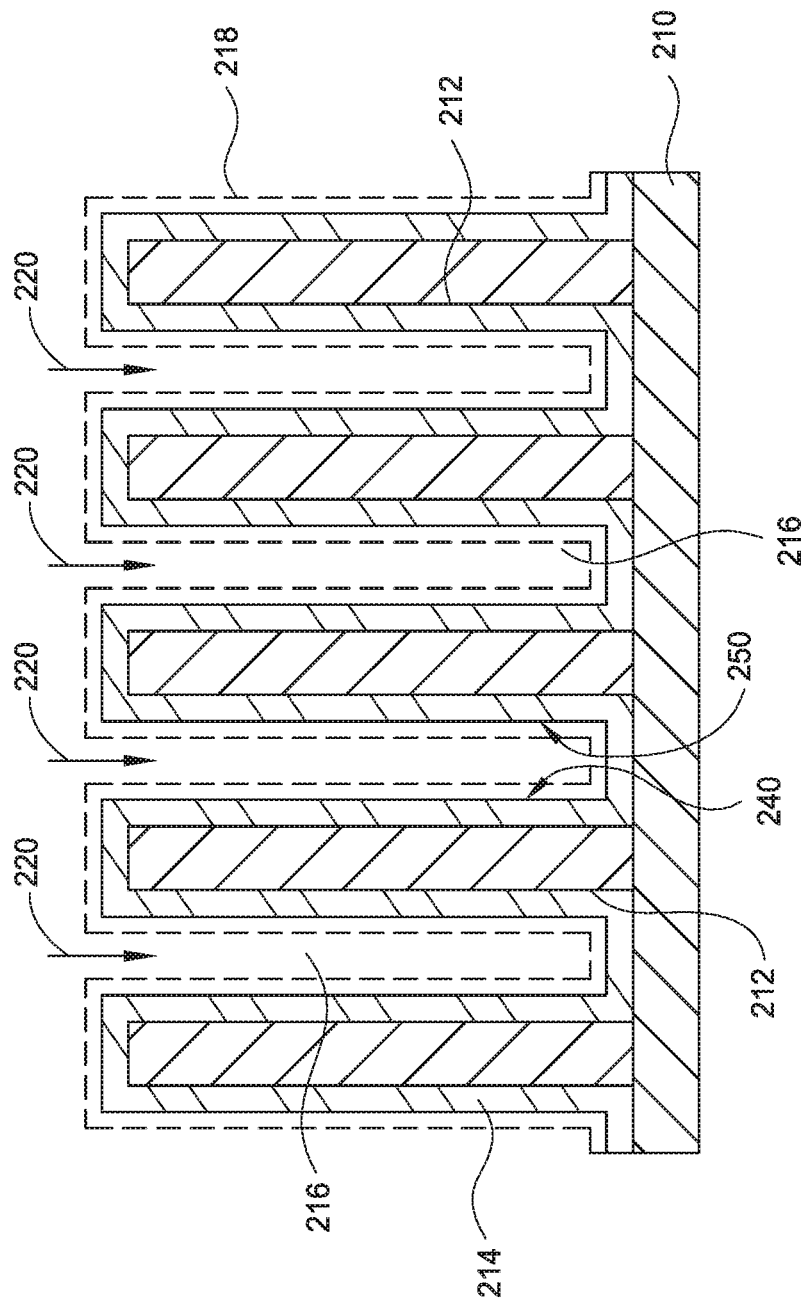
FIG. 2C is a sectional view of a substrate at one operation of the method of FIG. 1.

During the high pressure anneal, the oxidizer 220 is carried into the seams 216 by the high pressure. The conformal layer 214 deposited within the substrate features 212 is exposed to the oxidizer 220 in FIG. 2C. The arrows illustrate the flow of the oxidizer 220 into the seams 216. During the anneal process, the conformal layer 214 oxidizes as a result to exposure of the oxidizer 220. As a result of the oxidation, the conformal layer 214 undergoes a volume expansion. That is, the volume of the conformal layer 214 increases, such as to an expanded volume 218, shown in phantom. The expanded volume 218 shown in FIG. 2C represents conformal layer 214 undergoing volume expansion during the high pressure anneal.

Figure 2D:
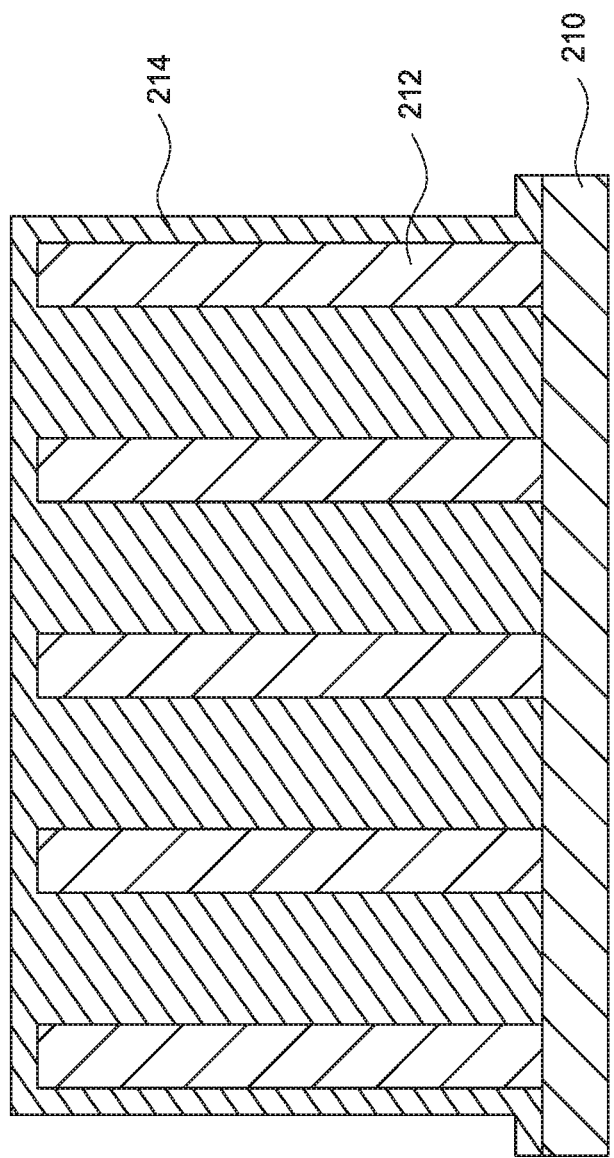
FIG. 2D is a sectional view of a substrate at one operation of the method of FIG. 1.

As a result of the oxidation process of the high-pressure anneal of the high pressure anneal, the conformal layer 214 is converted to a densified oxide substantially free of the seams 216 as shown in FIG. 2D. As the conformal layer 214 expands during the high pressure anneal, portions of the conformal layer 214 that do not contact, such as portions 240, 250 of the conformal layer 214 opposed across the seam 216, expand until the portions interact with one another. Oxidation at the seam boundary facilitates reaction between portions 240, 250, such that the atoms of the oxidizer 220 react and/or cross-link with each portion 240, 250. The reaction and/or cross-linking of portions 240, 250 across the seam 216 results in formation of a unified structure and removal of the seam. In examples wherein the conformal layer 214 is crystalline in structure, the oxidizer 220 results in joining of the crystal structures of portions 240, 250, thereby eliminating the seam 216.

In addition to healing seams in the conformal layer 214, the high pressure anneal of operation 208 densifies the conformal layer 214 via the inclusion of additional oxide, further improving the electrical insulating properties of the conformal layer 214.

FIG. 1 illustrates one embodiment of treating a substrate 210. However, additional embodiments are also contemplated. In another aspect, operations 104 and 108 may occur in the same chamber without operation 106. In another aspect, operation 104 may include multiple deposition steps or cycles to form the conformal layer 214.

Additionally, it is contemplated the conformal layer 214 may be a layer other than silicon dioxide, such as silicon, germanium, a metal layer, a metal oxide layer, or combinations thereof. In such an embodiment, the metals used to form the conformal layer 214 include aluminum, titanium, vanadium, chromium, manganese, iron, cobalt, nickel, copper, yttrium, zirconium, hafnium, molybdenum, and alloys thereof, among others. The metals may also be used in combination with one another.

In other embodiments, it is contemplated that deposition processes other than CVD may be used to deposit material in the substrate features 212. For example, atomic layer deposition (ALD), plasma-enhanced, ALD, plasma-enhanced CVD, physical vapor deposition (PVD), plating, or other deposition methods may be utilized, according to various materials to be deposited in the substrate features 212.

Moreover, while FIGS. 2A-2D illustrate a substrate 210 having trenches thereon, it is contemplated that the substrate features 212 other than trenches may benefit from aspects of the disclosure.

Figure 3:
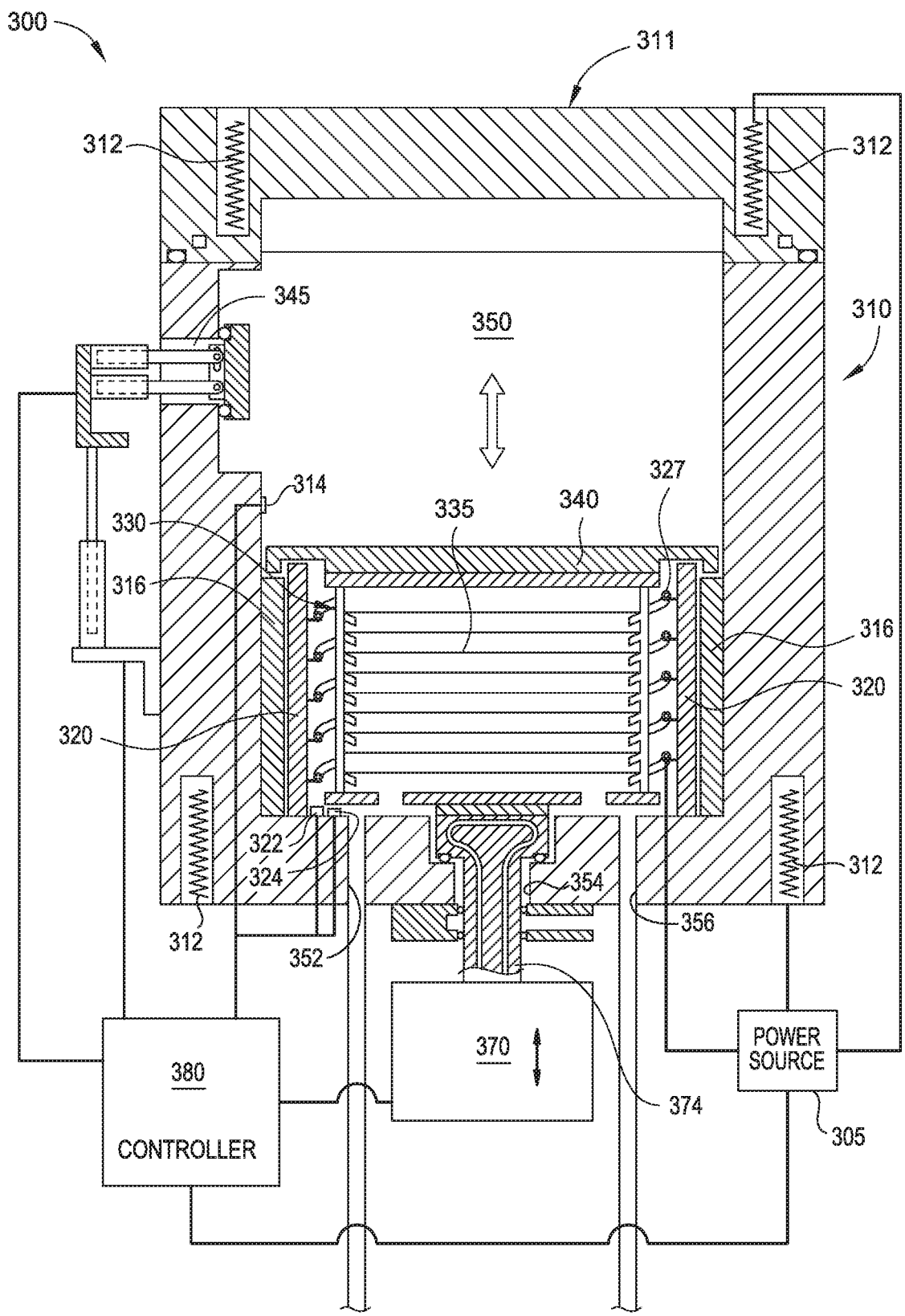
FIG. 3 is a sectional view of an exemplary annealing chamber.

FIG. 3 is a schematic sectional view of an exemplary processing chamber which may be practiced with the methods described herein. The batch processing chamber 300 has a cassette 330 disposed in an internal volume 350 for processing a plurality of substrates 335. The batch processing chamber 300 has a chamber body 310 enclosing the internal volume 350, and a lid 311 disposed on the chamber body 310. One or more cartridge heaters 312 are disposed within the chamber body 310. The heaters 312, such as resistive heaters, are configured to heat the chamber body 310. Power to the heaters 312 is controlled by the controller 380. A shell 320 is disposed within the internal volume 350. An insulating liner 316 is disposed in the internal volume 150 surrounding the shell 320. The insulating liner 316 prevents heat transfer between chamber body 310 and the shell 320.

The cassette 330 couples to a shaft 374 which extends through an opening 354 in the chamber body 110. The cassette 330 is moveably disposed within the internal volume 350 by an actuator 370 coupled to the shaft 374. The cassette 130 facilitates transfer of substrates 335 between a loading position and a processing position. Substrates 335 are transferred into and out of the internal volume 350 thorough a loading port 395 formed in the chamber body 310. The shell 320 couples to the lid 340 of the cassette 330 when the cassette 330 is in the processing position and defines a processing region wherein the substrates 335 are annealed at an elevated pressure and an elevated temperature.

During processing, a processing fluid, such as an oxidizer 220, is flowed into the processing region through an inlet port 352. The inlet port 352 is in fluid communication with the substrates 335 through a plurality of apertures 333 in the cassette 330. Auxiliary heaters 327, disposed within the processing region, are configured heat the processing volume and the substrates 335 therein. The pressure and temperature within the processing region are raised in order to anneal the substrates 335 therein. The processing fluid is evacuated from the processing region through an outlet port 356.

The controller 380 is coupled to a plurality of sensors 314, such as temperature sensors or pressure sensors. The sensors 314 provide signals to the controller 380 to indicate the conditions within the internal volume 350. The controller 380 controls the flow of the processing fluid as well as the power supplied to the heaters 312 and auxiliary heaters 327 to process the substrates 335 in a desired manner. In such a manner, the controller 380 is configured to control aspects of the processing chamber 300 to perform operations as disclosed herein.

In one example of operations disclosed herein, a substrate 210 containing one or more substrate features 212 is positioned in a process chamber. A conformal layer 214 is deposited on the substrate features 212 of the substrate 210. The substrate 210 is transferred to an anneal chamber. A high pressure anneal is performed on the substrate 210, and the conformal layers 214 expand in volume such that adjacent conformal layers contact and/or chemically react with one another.

The method described herein results in a high quality oxide layer that is substantially free of seams or voids. The layer is oxidized in a substantially uniform manner across the entirety of the layer, thereby increasing uniformity of the distribution of oxygen throughout the layer. Further, the uniformity of the densification of the oxide layer is increased by the methods described herein. The uniform densification also results in improved etch selectivity.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, comprising:
positioning the substrate in a process chamber, the substrate having a plurality of substrate features;
depositing a conformal layer on the substrate features, such that a seam is formed between neighboring substrate features; and
treating the substrate with a high pressure anneal in the presence of an oxidizer comprising steam, such that the volume of the seams within the conformal layer are reduced.

2. The method of claim 1, wherein the high pressure anneal is performed at a temperature of about 200 degrees Celsius to about 500 degrees Celsius.

3. The method of claim 1, wherein the high pressure anneal is performed for a time of about 5 minutes to about 120 minutes.

4. The method of claim 1, wherein the conformal layer comprises a silicon layer, a metal layer, a metal suboxide layer, or combinations thereof.

5. The method of claim 1, wherein the plurality of substrate features comprise a trench.

6. The method of claim 1, wherein the depositing a conformal layer on the plurality of substrate features comprises chemical vapor deposition.

7. The method of claim 1, wherein the volume of the conformal layer expands during the high pressure anneal.

8. The method of claim 6, wherein the depositing the conformal layer comprises flowing a precursor into the process chamber, wherein the precursor comprises silicon and hydrogen.

9. A method of processing a substrate, comprising:
positioning the substrate in a process chamber, the substrate having a plurality of substrate features;
depositing a conformal layer on the substrate features, such that a seam is formed between neighboring substrate features, wherein the conformal layer is crystalline in structure; and
treating the substrate with a high pressure anneal in the presence of an oxidizer, such that a volume of the seams within the conformal layer are reduced.

10. The method of claim 9, wherein the treating the substrate causes the conformal layer disposed on the substrate feature to chemically react with the conformal layer disposed on the neighboring substrate feature.

11. The method of claim 9, wherein the high pressure anneal is performed at a pressure of about 1 bar to about 70 bar.

12. The method of claim 9, wherein the high pressure anneal is performed at a temperature of about 200 degrees Celsius to about 500 degrees Celsius.

13. The method of claim 9, wherein the high pressure anneal is performed for a time of about 5 minutes to about 120 minutes.

14. The method of claim 9, wherein the conformal layer comprises a silicon layer, a metal layer, a metal suboxide layer, or combinations thereof.

15. The method of claim 9, wherein the plurality of substrate features comprise a trench.

16. The method of claim 9, wherein the depositing a conformal layer on the plurality of substrate features comprises chemical vapor deposition.

17. The method of claim 16, wherein the depositing the conformal layer comprises flowing a precursor into the process chamber, wherein the precursor comprises silicon and hydrogen.

18. A method of processing a substrate, comprising:
   positioning the substrate in a process chamber, the substrate having a plurality of substrate features;
   depositing a conformal layer on the substrate features, such that a seam is formed between neighboring substrate features; and
   treating the substrate with a high pressure anneal at a pressure of about 1 bar to about 70 bar in the presence of an oxidizer, such that the volume of the seams within the conformal layer are reduced.

19. The method of claim 18, wherein the conformal layer is crystalline in structure.

20. The method of claim 18, wherein the oxidizer comprises steam.

* * * * *